United States Patent [19]

Wisotzky et al.

[11] 4,145,665
[45] Mar. 20, 1979

[54] REGULATING AMPLIFIER

[75] Inventors: Otto G. Wisotzky, San Francisco; Tom L. Blackburn, San Jose, both of Calif.

[73] Assignee: GTE Automatic Electric Laboratories, Inc., Northlake, Ill.

[21] Appl. No.: 881,464

[22] Filed: Feb. 27, 1978

[51] Int. Cl.² ............................................. H03G 3/30
[52] U.S. Cl. .................................. 330/254; 330/279; 330/280; 330/281; 330/284
[58] Field of Search ............... 330/254, 145, 279, 280, 330/281, 284

[56] References Cited

U.S. PATENT DOCUMENTS 3,962,650  6/1976  Gay ..................................... 330/254

Primary Examiner—James B. Mullins
Attorney, Agent, or Firm—Russell A. Cannon

[57] ABSTRACT

An AC input signal and a DC supply voltage are applied to a tapped coil having end points from which differential input signals are coupled to a differential variolosser that controls the gain of cascaded differential amplifiers. The two output terminals of the cascaded amplifiers are electrically connected together through a pair of equal valued resistors to provide a DC reference voltage at the junction of the two resistors, where the AC signals cancel. The reference voltage is coupled to one side of a high-gain differential control amplifier and to both sides of a differential half-wave rectifier circuit. One side of the rectifier is also connected to one output of the cascaded amplifiers for detecting an amplified signal there. The detected signal is integrated and coupled to the other side of the control amplifier to produce the control signal which regulates the drive current to and loss presented by the variolosser, and thus the level of the input signals to the cascaded amplifiers.

17 Claims, 3 Drawing Figures

REGULATING AMPLIFIER

BACKGROUND OF INVENTION

This invention relates to regulating amplifiers, and more particularly to a regulating amplifier for receive circuitry of a radio or subscriber carrier telephone system.

Regulating amplifiers are used in the receive section of radios and in carrier subscriber telephone systems to maintain the level of an input signal at approximately a prescribed value there. In this manner, the input signal is adequate for detection and processing, and is limited to prevent overdriving receive circuitry. A conventional multistage regulating amplifier generally employs discrete transistors and has a single-ended input stage with diode variolossers having separate AC and DC paths. A number of tantalum capacitors are required in such a prior-art regulating amplifier to satisfy bypass and coupling requirements in and between stages, and to provide the necessary isolation in the variolosser. Such an amplifier also requires additional components for temperature compensation. Since tantalum capacitors are expensive, it is desirable to either reduce their size or to eliminate as many of them as possible. An object of this invention is the provision of an improved regulating amplifier.

SUMMARY OF INVENTION

In accordance with this invention, a regulating amplifier comprises: input circuit means responsive to DC and AC input signals for producing on first and second output terminals thereof the DC signal and AC signals of equal amplitude and opposite phase; differential variolosser means having a pair of input terminals electrically connected to associated output terminals of said input circuit means, having a pair of output terminals, and having an input-control terminal; differential amplifier means having a pair of input terminals electrically connected to associated output terminals of said differential variolosser means and having a pair of output terminals; resistive means electrically connected between the output terminals of said differential amplifier means for producing a DC reference voltage at an output terminal of said resistive means and at which the AC output signals of said differential amplifier means cancel; differential detector means having a first input terminal electrically connected to one output terminal of said differential amplifier means and having a second input terminal electrically connected to the output terminal of said resistive means, and having an output terminal from which the detected signal is coupled; and first control means comprising a differential amplifier having first and second input terminals responsive to the DC reference potential and the detected signal, respectively, for producing a control signal which is electrically connected to the control terminal of said differential variolosser means for controlling the loss thereof.

DESCRIPTION OF DRAWINGS

This invention will be more fully understood from the following description of preferred embodiments thereof, together with the drawings in which.

DESCRIPTION OF PREFERRED EMBODIMENTS

Figure 1:
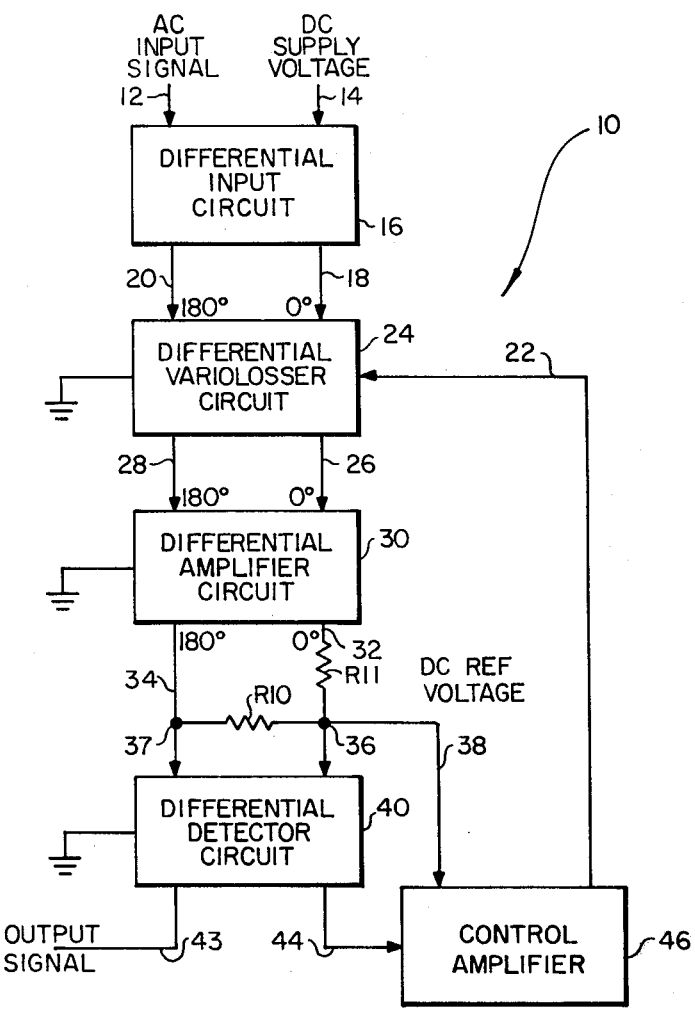
FIG. 1 is a schematic block diagram of a regulating amplifier 10 embodying this invention.

Referring now to FIG. 1, the regulating amplifier 10 generally comprises a differential input circuit 16, differential variolosser circuit 24, differential amplifier circuit 30, differential detector circuit 40, and control amplifier 46. The input circuit 16 is responsive to an AC input signal on line 12 and a DC supply voltage on line 14 for producing on lines 18 and 20 the DC voltage and equal amplitude AC signals there which are 180° out-of-phase. The differential variolosser 24 adjusts the level of the AC signals on lines 18 and 20 which are then applied to and amplified by circuit 30 which preferably comprises cascaded differential amplifier stages. Output lines 32 and 34 of circuit 30 are electrically connected together through equal valued resistors R10 and R11 to produce a DC reference voltage at node 36. The amplified AC signals on lines 32 and 34 cancel at node 36 since they are of equal amplitude and 180° out-of-phase there. In this manner, a DC reference voltage is produced without the need for coupling capacitors. The node 37 is at substantially the same DC potential as node 36. The output line 34 and node 36 are connected to associated input lines to circuit 40 which detects the amplified signal on line 34. The detected signal on line 44 is applied to the control amplifier 46 which produces a control voltage on line 22. The control voltage is applied to the variolosser 24 to adjust the amount of loss provided thereby, and thus the level of the input signal applied to the amplifier circuit 30.

Figure 2:
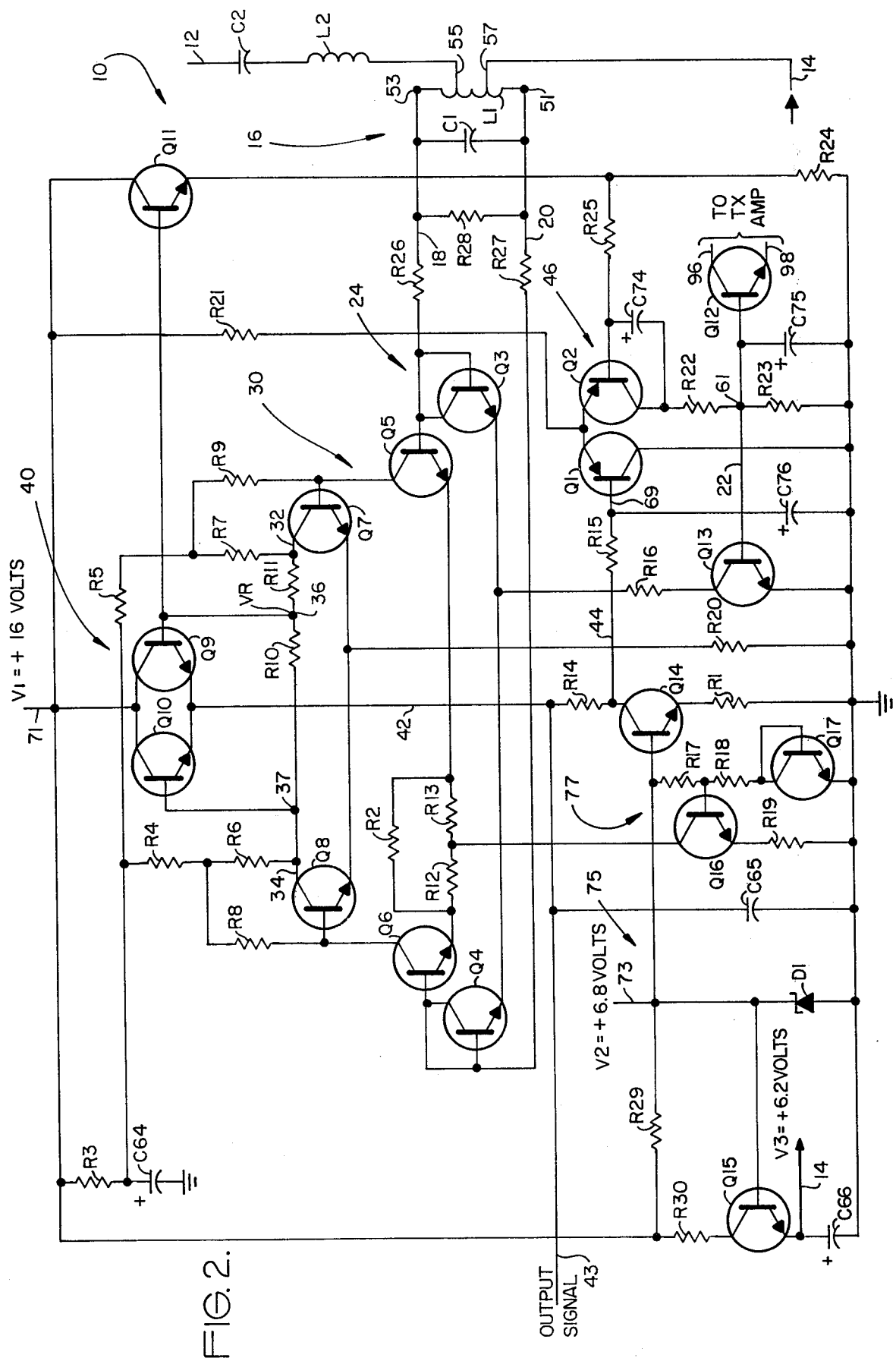
FIG. 2 is a circuit diagram of a preferred embodiment of the amplifier 10 in FIG. 1.

A preferred embodiment of the regulating amplifier 10 which was built and successfully operated in the receive section of a subscriber carrier telephone system, for example, is illustrated in more detail in FIG. 2. The amplifier 10 there is designed so that it may be fabricated with integrated circuit elements including a plurality of active elements formed on a common semiconductor chip. This is particularly advantageous for providing a regulating amplifier having a high degree of temperature stability since pairs of elements there are automatically matched without having to select matched pairs of elements. This amplifier 10 in FIG. 2 was designed to operate over a frequency band of 70 kHz to 142 kHz which was divided into six spaced apart frequency bands of 12 kHz bandwidth by associated balanced channel unit filters. The differential input circuit 16 comprises a balanced bandpass channel filter including coils L1 and L2, capacitors C1 and C2, and a terminating resistor R 28. The end points 51 and 53 of L1 are connected to the input lines 18 and 20 to the variolosser. The AC signal is coupled through L2 and C2 to the center point 55 of coil L1 so that equal amplitude AC signals, which are 180° out-of-phase, are produced on lines 18 and 20. A 6.2 volt DC supply voltage V3, for example, on line 14 is connected to a point 57 of the coil L1 to produce DC voltages of substantially the same amplitude on lines 18 and 20. Since the DC resistance of L1 is small, the DC voltage V3 may be connected to the coil at a point other than the center point 55 thereof. Alternatively, both the AC signal and the DC signal may be connected to the center point 55 of L1. In practice, the elements L2, C1 and C2, and R28 are not essential to this invention, but are included here to illustrate an application thereof.

The variolosser 24 comprises differentially connected transistors Q3 and Q4 having their base and collector electrodes tied together so as to operate as diodes, a pair of input resistors R26 and R27, and a control element Q13. The collectors of Q3 and Q4 are connected through R26 and R27 to the DC supply voltages on associated output lines 18 and 20 of circuit 16. The need for coupling capacitors between the input circuit and the variolosser circuit is overcome by the use of differential circuits 16 and 24 here and common AC and DC input lines 18 and 20. The emitters of Q3 and Q4 are connected through a current-limiting resistor R16 and Q13 to ground. The base of Q13 is responsive to the voltage on line 22 for controlling the level of conduction of Q13 and, thus, the drive current to active elements Q3 and Q4. The loss presented by Q3 and Q4 is approximately equal to the ratio of the input resistances R26 and R27 and the resistances of Q3 and Q4, respectively.

The circuit 30 comprises a plurality of stages of differential amplification which are connected in series-cascade. More specifically, the differential amplifier circuit 30 in FIG. 2 comprises two stages of amplification including Q5-Q6 and Q7-Q8. The bases of Q5 and Q6 are connected to outputs of associated variable loss elements Q3 and Q4. The emitters of Q5 and Q6 are electrically connected together through R2 (which provides current feedback for stabilization of this differential amplifier stage) and through R12 and R13 to a constant current source 77 comprising Q16 and Q17 and resistors R17, R18 and R19. The use of a differential input circuit 16 here makes it possible to change the gain of circuit 30 without the use of bypass capacitors in the latter. The differential output signals at the Q5 and Q6 collectors drive the base electrodes of the next stage Q7-Q8 of amplification. The Q7 and Q8 emitters are connected to ground through current-limiting resistor R20 so that they are also driven by a constant current. The collector of Q7 is resistively connected through R3, R5 and R7 to the +16 volt supply voltage V. Similarly, the Q8 collector is resistively connected through R3, R4 and R6 to the supply voltage V1. The Q7 and Q8 collectors are also connected through R7, R9 and R6, R8, respectively, to their base electrodes to provide negative feedback for stabilization of the second stage of amplification. The elements R3 and C64 operate as a lowpass filter for removing any ripple from the supply voltage V1 on line 71. Additional stages of differential amplification may be employed here to increase the gain of amplifier 30 to any desired value. The differentially amplified output signals on lines 32 and 34 are of equal amplitude and 180° out-of-phase. In order to provide a DC reference voltage at node 36 without using bypass capacitors, the collectors of Q7 and Q8 are also electrically connected together through resistors R10 and R11 which have the same value of resistance, say 110 kohms. The amplified AC signals on the Q7 and Q8 collector lines 32 and 34 are the same amplitude and 180° out-of-phase so that they cancel at node 36. The DC voltages at the Q7 and Q8 collectors are also the same values. Thus, the DC voltages at nodes 36 and 37 are substantially the same values, except for a very small offset voltage caused by a very small bias current through R11 and the Q11 base-emitter junction diode. Since these nodes 36 and 37 are floating, the voltages there track each other as a function of temperature.

The detector circuit 40 is essentially a half-wave rectifier comprising differentially connected transistors Q9 and Q10 which have their collector electrodes connected to the supply voltage V1 on line 71. The Q9 base electrode is connected to the DC reference voltage at node 36. The Q10 base electrode is connected to node 37 and on line 34 to the output of Q8. The Q9 and Q10 emitter electrodes are connected through load resistor R14, Q14 and emitter resistor R1 to ground. The Q14 base electrode is connected to the 6.8 volt DC supply voltage V2 on line 73 for causing Q14 to operate as a constant current source for driving Q9 and Q10. R1 sets the current level in Q14. R14 provides a means to set the level of the output signal on line 43. The detected signal on line 42 is connected through C65 to ground. This capacitor C65 operates as a high-pass filter for shorting any carrier frequency signal to ground and away from the output line 43.

The control amplifier 46 is a high-gain differential amplifier comprising transistors Q1 and Q2 having their emitter electrodes connected through bias resistor R21 to the supply voltage V1, the collector of Q1 being directly electrically connected to ground and the collector of Q2 being electrically connected to ground through a voltage divider comprising R22 and R23. The tap 61 of the voltage divider is connected on line 22 to the Q13 base for controlling conduction thereof. The detected signal on line 44 is coupled through R15 to the Q1 base, which is also conneted through C76 to ground. The elements R15 and C76 operate as an audio filter which integrates the rectified signal for producing the feedback signal on the Q1 base. The Q2 base is electrically connected through bias resistors R25 and R24 to ground, and through R25 and the Q11 base-emitter junction diode to the node 36. In this manner, the feedback circuits from the reference voltage $V_R$ to the Q1 and Q2 base electrodes are substantially symmetrical so that they will track each other as a function of temperature. The capacitors C74 and C75 are connected across the Q2 base-collector junction diode and R23, respectively. These capacitors and C76 are employed to prevent oscillation in the circuit 46, and thus in regulating amplifier 10 if Q2 should be abruptly turned on. More specifically, C76 and R15 comprise an integrating low-pass filter for the detected signal. Similarly, C75 and R23 comprise an integrating lowpass filter for slowing down the operation of Q13 in response to changes in conduction of Q2. C74 serves a similar function. It has been found that C74, C75 and C76 together operate to prevent Q13 being responsive to abrupt or transient changes in operation of Q2 (say for a 6 dB change in the amplitude of the input signal), and thus prevent oscillation of the feedback regulator amplifier 10. It is desirable that C74 and C75 have generally the same values of capacitance. It has been found that when C76 has the smaller and larger values, the regulation is underdamped and overdamped, respectively.

The circuit 75 comprising transistor Q15, Zener diode D1, resistors R29 and R30, and capacitor C66 operates as a constant voltage source for providing the 6.2 volt DC signal voltage V3 which is applied on line 14 to coil L1, and thus to the variolosser input lines 18 and 20. C66 there operates as a lowpass filter to bypass any AC signal on line 14 to ground. The transistor Q12 is responsive to the control voltage at mode 61 for providing a drive signal to and level regulation in a transmit amplifier (not shown). Q12 is also paired with Q13 to provide for a balanced circuit.

In operation, the DC supply voltage V3 produced by Q15 and D1 is coupled on line 14 to coil L1 to provide equal amplitude DC voltages on lines 18 and 20. These DC voltages cause variolosser elements Q3 and Q4 to pass a DC current through Q13, Q3, Q4 and line 14 which in turn sets the resistances presented by Q3 and Q4. Q13 controls the amount of current in Q3 and Q4, and thus the attenuation resistances of the variolosser.

A voice modulated carrier input signal on line 12 is differentially coupled through L1, lines 18 and 20, and R26 and R27 to amplifier circuit 30. The variolosser elements Q3 and Q4 adjust the level of the differential input signals at the Q5 and Q6 base electrodes. The element R2 is selected to adjust the gain of amplifier 30 which changes the variolosser current that is required for a given level of input signal at the Q5 and Q6 base electrodes. This selection of R2 is made to ensure proper operation of the amplifier 30 over a broad range of input signals such as 43 dB. The element R14 is selected to set the level of the output signal on line 43 at a desired value. In a regulating amplifier which was built and operated satisfactorily, the differential amplifier circuit 30 comprising active elements Q5-Q8 had about 43 dB of gain. Since the bases of Q9, Q10 and Q11 are all at substantially the same DC reference potential as is at node 36, they all operate on the same DC bias levels, which levels track each other very well as a function of temperature for producing excellent regulation characteristics. Since the base of Q2 is only offset from the reference voltage $V_R$ by the Q11 base-emitter junction diode voltage, the former also tracks variations in the reference voltage and the operation of Q9-Q11.

The amplified AC signal on the Q8 collector and line 34 is detected by Q10. The detected signal is integrated by R15 and C76 to produce the bias voltage on the Q1 base. The element Q14 supplies a current which is adjusted by R1 and passed by R14 to produce an offset voltage on line 43 and the Q1 base. With a larger offset across R14, it takes a larger detected signal to overcome the offset and turn Q1 off and Q2 on. A larger offset also turns Q1 on harder. If the level of the amplified signal from Q8 increases, the DC level of the integrated signal on line 69 will also increase to cause conduction of Q1 to decrease. Differential operation of circuit 46 then acuses conduction of Q2 to increase so as to raise the voltage produced at node 61. This voltage on R23 forward biases Q13 to make it conduct more heavily through Q3 and Q4 so as to decrease the values of resistance presented thereby. This causes an increase in the loss presented by the variolosser. This means that the level of the AC signals on lines 18 and 20 that are applied to the Q5 and Q6 base electrodes decreased to cause a corresponding decrease in the level of the amplified signal from Q8 on line 34. In this manner, the desired regulation of the input signal is obtained.

Figure 3:
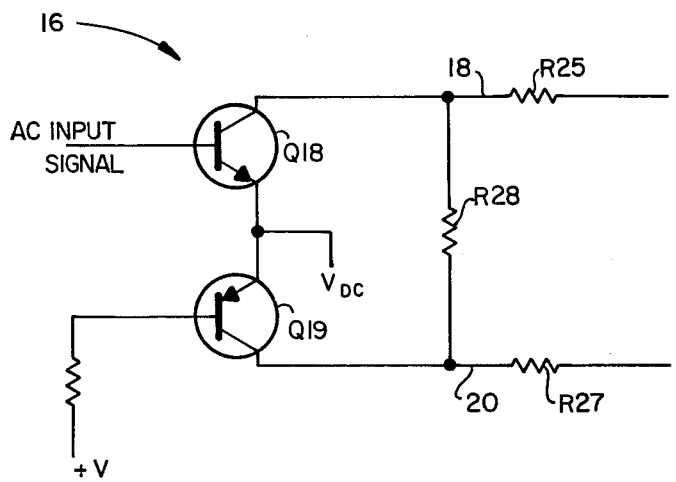
FIG. 3 is a circuit diagram illustrating a modified form of the input circuit 16 in FIGS. 1 and 2.

Although this invention is described in relation to preferred embodiment thereof, variations and modifications thereof will occur to those skilled in the art without parting from the spirit of this invention. By way of example, the input circuit 16 may comprise a pair of transistors Q18 and Q19 which are connected as is shown in FIG. 3. The DC signal is applied to the emitters of Q18 and Q19 which have their collectors directly connected to lines 18 and 20 and connected together through a load resistor R28. Alternatively, the circuit 16 may comprise a resistance bridge, an auto transformer, a coil having a number of taps thereon, or a coil having both of the lines 12 and 14 connected to the center tap 55 thereof. Also, the DC reference voltage may be produced by other types of resistive means such as a potentiometer, variable resistors, or FET's. Further, the elements Q3 and Q4 may be diodes. Additionally, other types of constant voltage sources may be employed to provide constant drive current to the various circuit stages in amplifier 10. The scope of this invention is therefore to be determined from the following claims rather than the aforementioned detailed description of embodiments thereof.

What is claimed is:

1. A regulating amplifier comprising:
   input circuit means responsive to DC and AC input signals for producing on first and second output terminals thereof the DC signal and AC signals of equal amplitude and opposite phase;
   differential variolosser means having a pair of input terminals electrically connected to associated output terminals of said input circuit means, having a pair of output terminals, and having an input-control terminal;
   differential amplifier means having a pair of input terminals electrically connected to associated output terminals of said differential variolosser means and having a pair of output terminals;
   resistive means electrically connected between the output terminals of said differential amplifier means for producing a DC reference voltage at an output terminal of said resistive means and at which the AC output signals of said differential amplifier means cancel;
   differential detector means having a first input terminal electrically connected to one output terminal of said differential amplifier means and having a second input terminal electrically connected to the output terminal of said resistive means, and having an output terminal from which the detected signal is coupled; and
   first control means comprising a differential amplifier having first and second input terminals responsive to the DC reference potential and the detected signal, respectively, for producing a control signal which is electrically connected to the control terminal of said differential variolosser means for controlling the loss thereof.

2. The regulating amplifier according to claim 1 wherein said differential variolosser means comprises: first and second active elements each having a first electrically eletrically connected to an associated input terminal of said differential amplifier means and electrically connected through associated first and second resistive elements to associated output terminals of said input circuit means and each having a second electrode; and second control means electrically connected to the second terminals of said first and second active elements and responsive to the control signal from said first control means for controlling the amount of drive current passed to said first and second active elements for controlling the losses presented thereby to signals from said input circuit means for application to associated input terminals of said differential amplifier means.

3. The regulating amplifier according to claim 2 wherein said differential amplifier means comprises a plurality of stages of differential amplification electrically connected in cascade.

4. The regulating amplifier according to claim 3 wherein said differential detector means comprises differentially connected first and second transistors having emitter and collector electrodes eletrically connected together, respectively, with the base of said first transistor being electrically connected to the output terminal of said resistive means and the base of said second transistor being electrically connected to the one output terminal of said differential amplifier means.

5. The regulating amplifier according to claim 4 wherein said differential detector means further comprises means providing a constant current drive to said first and second transistors.

6. The regulating amplifier according to claim 4 wherein said first control means further comprises an integrator circuit for integrating the detected signal, said differential amplifier of said control means including a third transistor having a base responsive to the integrated signal produced by said integrating circuit and a fourth transistor having its base responsive to the DC reference signal, and means coupling one of the emitter and collector electrodes of said fourth transistor to said second control means for controlling the drive current to said first and second active elements, and thus the loss presented thereby.

7. The regulating amplifier according to claim 6 including a fifth transistor emitter-base junction diode in the electrical connection of the DC reference voltage to the fourth transistor base electrode.

8. The regulating amplifier according to claim 6 wherein said resistive means comprises third and fourth resistive elements having the same values of resistance, being electrically connected in series between the two output terminals of said differential amplifier means, the output terminal of said resistive means being electrically connected to the junction of said third and fourth resistive elements.

9. The regulating amplifier according to claim 8 wherein said coupling means of said first control means comprises a voltage divider including fifth and sixth resistive elements electrically connected in that order between one of said fourth transistor emitter and collector electrodes and a reference potential, the tap point of said voltage divider being electrically connected to said second control means for controlling the drive current to said differential variolosser means.

10. The regulating amplifier according to claim 9 wherein said first control means further comprises a first capacitive element electrically connected in parallel with the sixth resistive element.

11. The regulating amplifier according to claim 10 wherein said first control means further comprises a second capacitor electrically connected across the base-collector junction diode of said fourth transistor and said integrating circuit comprises a third capacitor electrically connected across the third transistor base-collector junction diode.

12. The regulating amplifier according to claim 11 wherein said second and third capacitors having substantially the same values of capacitance.

13. The regulating amplifier according to claim 1 wherein said input circuit means comprises a tapped inductor.

14. The regulating amplifier according to claim 1 wherein said input circuit means comprises a low-resistance inductive coil having a pair of points thereon electrically connected to output terminals of the former, a first intermediate point on the coil receiving the AC input signal, a second intermediate point on the coil receiving the DC input signal.

15. The regulating amplifier according to claim 1 wherein said input means comprises an auto transformer.

16. The regulating amplifier according to claim 1 wherein said input circuit means comprises first and second transistors having their primary conduction paths electrically connected in series between the output terminal of said input circuit means, the DC signal being electrically connected to the junction of ones of the emitter and collector electrodes of said first and second transistors which are in the primary conduction paths thereof and are electrically connected together, the AC signal being applied to at least one of the base electrodes of said first and second transistors.

17. The regulating amplifier according to claim 16 wherein said input circuit means further comprises a first resistive element electrically connected across the other ones of the emitter and collector electrodes of said first and second transistors and said differential variolosser means comprises second and third resistive elements electrically connected to associated ones of the other ones of the emitter and collector electrodes of said first and second transistors.

* * * * *

UNITED STATES PATENT AND TRADEMARK OFFICE
CERTIFICATE OF CORRECTION

PATENT NO. : 4,145,665
DATED : March 20, 1979
INVENTOR(S) : Otto G. Wisotzky & Tom L. Blackburn It is certified that error appears in the above-identified patent and that said Letters Patent are hereby corrected as shown below:

Column 2, line 53, "R 28" should read -- R28 --.

Column 4, line 27, "conneted" should read -- connected --; and line 63, "mode" should read -- node --.

Column 5, line 43, "acuses" should read -- causes --; and line 55, "embodiment" should read -- embodiments --.

In Claim 2 at column 6, line 47, "electrically eletrically" should read -- electrode electrically --.

In Claim 6 at column 7, line 13, after "said" (second occurrence) insert -- first --.

Signed and Sealed this

Sixth Day of November 1979

[SEAL]

Attest:

RUTH C. MASON
Attesting Officer

LUTRELLE F. PARKER
Acting Commissioner of Patents and Trademarks